(12) United States Patent
Lee et al.

(10) Patent No.: US 11,462,573 B2
(45) Date of Patent: Oct. 4, 2022

(54) DISPLAY PANEL

(71) Applicant: Samsung Display Co., LTD., Yongin-si (KR)

(72) Inventors: Juhyun Lee, Seongnam-si (KR); Gyungmin Baek, Yongin-si (KR); Hongsick Park, Suwon-si (KR); Sangwon Shin, Yongin-si (KR); Hyuneok Shin, Gwacheon-si (KR); Shin Il Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 212 days.

(21) Appl. No.: 16/877,596

(22) Filed: May 19, 2020

(65) Prior Publication Data

US 2020/0395389 A1 Dec. 17, 2020

(30) Foreign Application Priority Data

Jun. 14, 2019 (KR) .......................... 10-2019-0070878

(51) Int. Cl.
| | |
|---|---|
| *H01L 27/12* | (2006.01) |
| *G02F 1/1333* | (2006.01) |
| *G02F 1/1362* | (2006.01) |
| *G02F 1/1368* | (2006.01) |

(52) U.S. Cl.
CPC ........ *H01L 27/1244* (2013.01); *G02F 1/1368* (2013.01); *G02F 1/133345* (2013.01); *G02F 1/136286* (2013.01)

(58) Field of Classification Search
CPC ........... H01L 27/1244; G02F 1/133345; G02F 1/136286; G02F 1/1368

USPC ............................................................ 257/72
See application file for complete search history.

(56) References Cited

U.S. PATENT DOCUMENTS

| | | |
|---|---|---|
| 10,386,687 B2 | 8/2019 | Yang et al. |
| 2002/0123176 A1 | 9/2002 | Izumi et al. |
| 2004/0262569 A1 | 12/2004 | Cho et al. |
| 2006/0189123 A1* | 8/2006 | Saitou ....................... C23F 1/26 |
| | | 257/E21.309 |
| 2014/0232972 A1 | 8/2014 | Kim et al. |

(Continued)

FOREIGN PATENT DOCUMENTS

| | | |
|---|---|---|
| KR | 10-0531077 B1 | 11/2005 |
| KR | 1020060131018 A | 12/2006 |

(Continued)

OTHER PUBLICATIONS

European Search Report for European Patent Application No. 20176991.6 dated Oct. 29, 2020.

*Primary Examiner* — Nathanael R Briggs
*Assistant Examiner* — William D Peterson
(74) *Attorney, Agent, or Firm* — Cantor Colburn LLP

(57) ABSTRACT

A display panel includes a base substrate, a pixel including a thin film transistor and a display element, a first signal line connected to the pixel, and a second signal line disposed on a layer different from the first signal line. At least one of the first signal line and the second signal line includes a lower layer including a conductive material and an upper layer disposed on the lower layer and including a conductive material. The upper layer has an etch selectivity in a range equal to or greater than about 0.5 and equal to or smaller than about 3 with respect to the lower layer.

20 Claims, 10 Drawing Sheets

(56) References Cited

U.S. PATENT DOCUMENTS

| | | | |
|---|---|---|---|
| 2015/0255494 A1 | 9/2015 | Hogan et al. | |
| 2016/0252785 A1 | 9/2016 | Kimura et al. | |
| 2018/0069128 A1* | 3/2018 | Shin | H01L 29/78633 |
| 2018/0314107 A1 | 11/2018 | Park et al. | |
| 2019/0333435 A1 | 10/2019 | Shin et al. | |
| 2020/0026134 A1 | 1/2020 | Lee et al. | |

FOREIGN PATENT DOCUMENTS

| | | |
|---|---|---|
| KR | 10-1341783 B1 | 12/2013 |
| KR | 1020140105092 A | 9/2014 |
| KR | 1020160060721 A | 5/2016 |
| KR | 1020180028084 A | 3/2018 |
| KR | 1020190031393 A | 3/2019 |

\* cited by examiner

DISPLAY PANEL

This application claims priority to Korean Patent Application No. 10-2019-0070878, filed on Jun. 14, 2019, and all the benefits accruing therefrom under 35 U.S.C. § 119, the contents of which are hereby incorporated by reference in its entirety.

BACKGROUND

1. Field

The present disclosure relates to a display panel. More particularly, the present disclosure relates to a display panel having a low external light reflectance.

2. Description of the Related Art

A display device includes signal lines and electronic elements which are connected to the signal lines to display an image. The signal lines and the electronic elements include a plurality of conductive layers.

SUMMARY

The present disclosure provides a display panel having relatively low external light reflectance and improved process reliability.

Embodiments of the invention provide a display panel including a base substrate, a pixel on the base substrate and including a thin film transistor and a display element which is connected to the thin film transistor, and a signal line connected to the pixel. The signal line includes a lower layer including a conductive material and an upper layer including a conductive material. The upper layer has an etch selectivity in a range equal to or greater than about 0.5 and equal to or smaller than about 3 with respect to the lower layer.

The upper layer may directly contact the lower layer.

The upper layer may include an opaque material and have a thickness equal to or smaller than about 100 angstroms.

The lower layer may include a first layer, a second layer having a specific resistance lower than the first layer, and a third layer having a light reflectance lower than the second layer. The upper layer may contact the third layer.

The upper layer may include a same material as the second layer.

The upper layer may have a thickness smaller than a thickness of each of the first, second, and third layers.

The upper layer and the second layer may include copper.

The first, second, and third layers may include a different material from the upper layer.

The upper layer may include a transparent conductive oxide material, a metal material, or a metal oxide material.

The etch selectivity may be with respect to a non-aqueous etchant.

A side surface of the upper layer and a side surface of the lower layer may be aligned with each other along a predetermined virtual line in a cross-section.

The virtual line may be inclined with respect to an upper surface of the base substrate.

The display panel may further including an insulating layer. The signal line may be provided in plurality including a first signal line and a second signal line each connected to the pixel. The first signal line and the second signal line may be in different layers from each other with the insulating layer interposed therebetween.

The thin film transistor includes a control electrode, an input electrode and an output electrode spaced apart from each other, and the output electrode connected to the display element.

The signal line may include at least one of the control electrode, the input electrode, and the output electrode.

The display element may include a pixel electrode, a common electrode, and an optical medium layer between the pixel electrode and the common electrode. The upper layer and the lower layer of the signal line may overlap with the pixel electrode in a plan view.

Embodiments of the invention provide a display panel including a base substrate, a pixel on the base substrate and including a thin film transistor and a display element which is connected to the thin film transistor, and a signal line connected to the pixel. The signal line includes an upper layer having a thickness equal to or smaller than about 100 angstroms, and a lower layer between the base substrate and the upper layer.

The lower layer may include a first layer including a first metal (e.g., metal material), a second layer making contact with the first layer and including a second metal (e.g., metal material) different from the first metal, and a third layer making contact with the second layer and the upper layer and including a third metal (e.g., metal material) the same as the first metal.

The upper layer may include a metal material the same as the second metal, and the second layer may be thicker than the upper layer.

The third layer may have a reflectance lower than the second layer and a specific resistance higher than the second layer.

According to one or more exemplary embodiment, the side surface of the signal line may be disposed along a single plane in the cross-section when the signal line having the low light reflectance is provided or formed. Therefore, damage or breakage of an insulating layer which covers the signal line, due to a non-uniform side surface of the signal line, may be reduced or effectively prevented. In addition, even though the signal line is disposed to overlap with an area at which light is emitted or through which an image is displayed, visibility of the signal line which is caused by the reflection of the external light, may be reduced. Thus, the reflectance of the external light of the display panel including such signal line may be reduced, and the process reliability of the display panel including such signal line may be improved.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
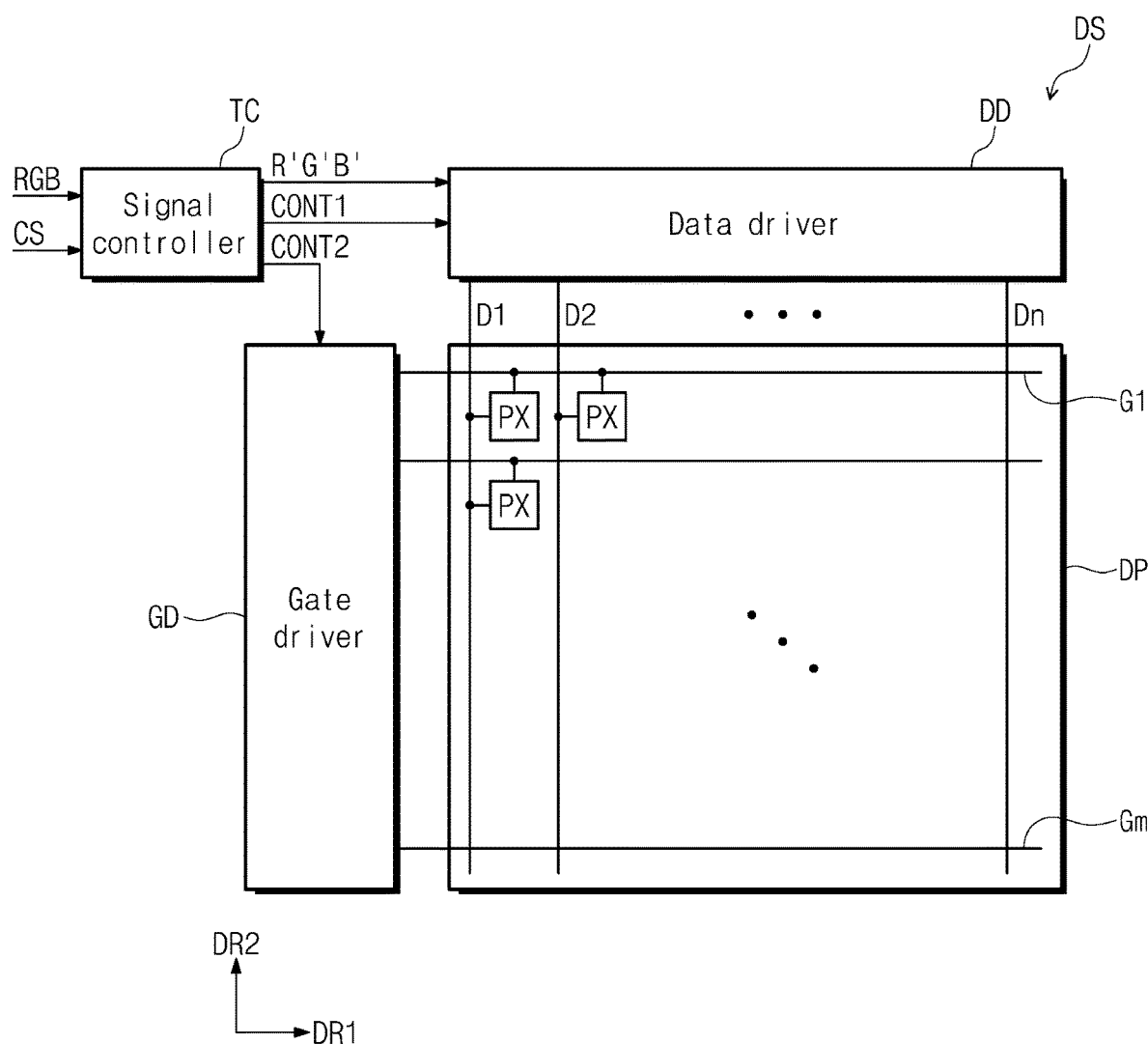
FIG. 1 is a block diagram showing an exemplary embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present disclosure, it will be understood that when an element or layer is referred to as being related to another element such as being "on", "connected to" or "coupled to" another element or layer, it can be directly on, connected or coupled to the other element or layer or intervening elements or layers may be present. In contrast, when an element or layer is referred to as being related to another element such as being "directly on", "directly connected to" or "directly coupled to" another element or layer, no intervening elements or layers are present.

Like numerals refer to like elements throughout. In the drawings, the thickness, ratio, and dimension of components are exaggerated for effective description of the technical content.

As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," "includes" and/or "including", when used in this specification, specify the presence of stated features, integers, steps, operations, elements, and/or components, but do not preclude the presence or addition of one or more other features, integers, steps, operations, elements, components, and/or groups thereof.

In a display device, the conductive layers of signal lines and/or electronic elements connected to the signal lines, may include an optically opaque material. The conductive layers may be recognized from outside the display device due to an external light reflected by the conductive layers. When the signal lines or the electronic elements are recognized from outside the display device due to the reflection of the external light, a visibility of the image displayed by the display device is affected by the reflected external light.

Hereinafter, the invention will be explained in detail with reference to the accompanying drawings.

Figure 2:
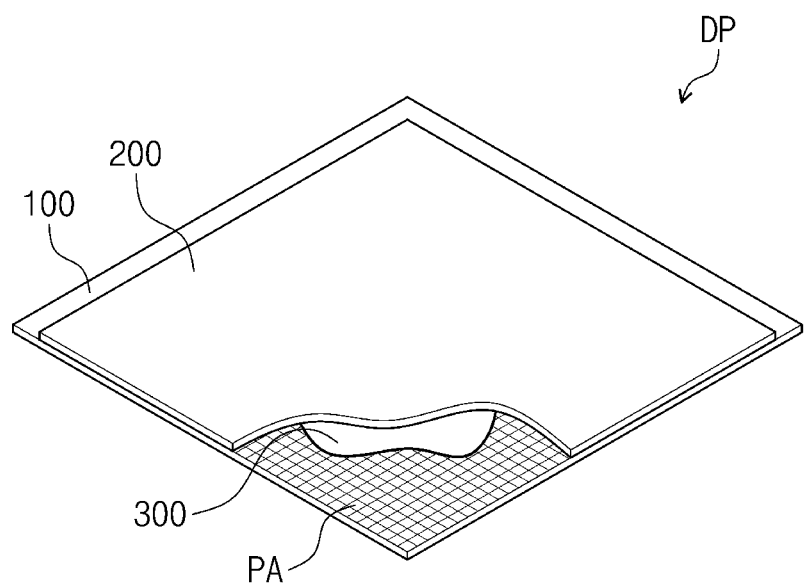
FIG. 2 is a perspective view showing an exemplary embodiment of the display device shown in FIG. 1.

FIG. 1 is a block diagram showing an exemplary embodiment of a display device DS. FIG. 2 is a perspective view showing an exemplary embodiment of a portion of the display device DS shown in FIG. 1. Hereinafter, the present disclosure will be described with reference to FIGS. 1 and 2.

Referring to FIG. 1, the display device DS includes a signal controller TC, a gate driver GD, a data driver DD, and a display panel DP.

The display panel DP is electrically connected to the gate driver GD and the data driver DD and operated by electrical signals provided from the gate driver GD and the data driver DD. The display panel DP should not be particularly limited, and for example, the display panel DP may be an organic light emitting display panel, a liquid crystal display panel, a plasma display panel, an electrophoretic display panel, or an electrowetting display panel. In the present exemplary embodiment, a liquid crystal display device including the liquid crystal display panel will be described as a representative example.

The display device DS may further include a backlight unit (not shown) providing a light to the display panel DP and an optical member including a polarizing plate. The display panel DP controls an amount of light transmitted therethrough among the light generated and provided from the backlight unit, to display an image. However, this is merely exemplary, and when the organic light emitting display panel is used as the display panel DP, the backlight unit may be omitted. Here, the organic light emitting display panel may generate and control light to generate an image.

The display panel DP includes a plurality of signal lines G1 to Gm and D1 to Dn, and a pixel PX provided in plurality (e.g., a plurality of pixels PX) which are connected to the signal lines G1 to Gm and D1 to Dn. The signal lines G1 to Gm and D1 to Dn include a plurality of gate lines G1 to Gm and a plurality of data lines D1 to Dn.

The gate lines G1 to Gm lengthwise extend along a first direction DR1 and are arranged along a second direction DR2 crossing the first direction DR1. The gate lines G1 to Gm connect the gate driver GD to the pixels PX. The gate lines G1 to Gm apply gate signals as electrical signals provided from the gate driver GD to the pixels PX, respectively. A thickness of the display device DS and components thereof is defined along a direction which crosses each of the first direction DR1 and the second direction DR2.

The data lines D1 to Dn lengthwise extend along the second direction DR2 and are arranged along the first direction DR1. The data lines D1 to Dn connect the data driver DD to the pixels PX. The data lines D1 to Dn apply data signals as electrical signals provided from the data driver DD to the pixels PX, respectively. The data lines D1 to Dn are insulated from the gate lines G1 to Gm while crossing the gate lines G1 to Gm.

Each of the pixels PX is connected to a corresponding gate line among the gate lines G1 to Gm and a corresponding data line among the data lines D1 to Dn. Each of the pixels PX includes a switching element such as a thin film transistor and a capacitor such as a liquid crystal capacitor which is connected to the thin film transistor. The pixels PX display the image by controlling an amount of electric charge in the liquid crystal capacitor. This will be described in detail later.

The signal controller TC applies electrical signals to the gate driver GD and the data driver DD to control an operation of the gate driver GD and the data driver DD. The signal controller TC receives input image signals RGB, converts the input image signals RGB to image data R'G'B' suitable for the operation of the display panel DP, and outputs the image data R'G'B'. In addition, the signal controller TC receives various control signals CS as electrical signals, e.g., a vertical synchronization signal, a horizontal synchronization signal, a main clock signal, and a data enable signal, and generates and outputs first and second control signals CONT1 and CONT2 as further electrical signals.

The data driver DD receives the first control signal CONT1 and the image data R'G'B'. The data driver DD converts the image data R'G'B' to data voltages and applies the data voltages as electrical signals to the data lines D1 to Dn. The first control signal CONT1 includes a horizontal start signal that starts the operation of the data driver DD, an inverting signal that inverts a polarity of the data voltages, and an output indicating signal that determines an output timing of the data voltages from the data driver DD.

The gate driver GD outputs the gate signals as electrical signals to the gate lines G1 to Gm in response to the second control signal CONT2. The second control signal CONT2 includes a vertical start signal that starts the operation of the gate driver GD, a gate clock signal that determines an output timing of a gate voltage, and an output enable signal that determines an on-pulse width of the gate voltage.

Referring to FIG. 2, the display panel DP may include a first substrate 100, a second substrate 200, and an optical control (or optical transmittance) layer such as a liquid crystal layer 300. The first substrate 100 may include a pixel area PA provided in plurality (e.g., a plurality of pixel areas PA). The pixels PX may be respectively disposed in the pixel areas PA. In the present exemplary embodiment of the present disclosure, the pixel areas PA may be planar areas at which the lights transmitted or generated by the pixels PX are displayed, respectively. Although not shown in figures, the first substrate 100 may include some components (e.g., conductive layer, insulating layer, light blocking layer, etc.) of the pixels PX.

The second substrate 200 is disposed on the first substrate 100. The second substrate 200 faces the first substrate 100 with the optical control layer therebetween. Although not shown in figures, the second substrate 200 may include some components (e.g., conductive layer, insulating layer, light-blocking layer, etc.) of the pixels PX.

The liquid crystal layer 300 is disposed between the first substrate 100 and the second substrate 200. The liquid crystal layer 300 may include an optical control medium such as liquid crystal molecules LC. The liquid crystal molecules LC may include a material whose alignment is controlled by an electric field provided or formed in the pixel areas PA. The liquid crystal layer 300 may be a component of the pixels PX.

Figure 3A:
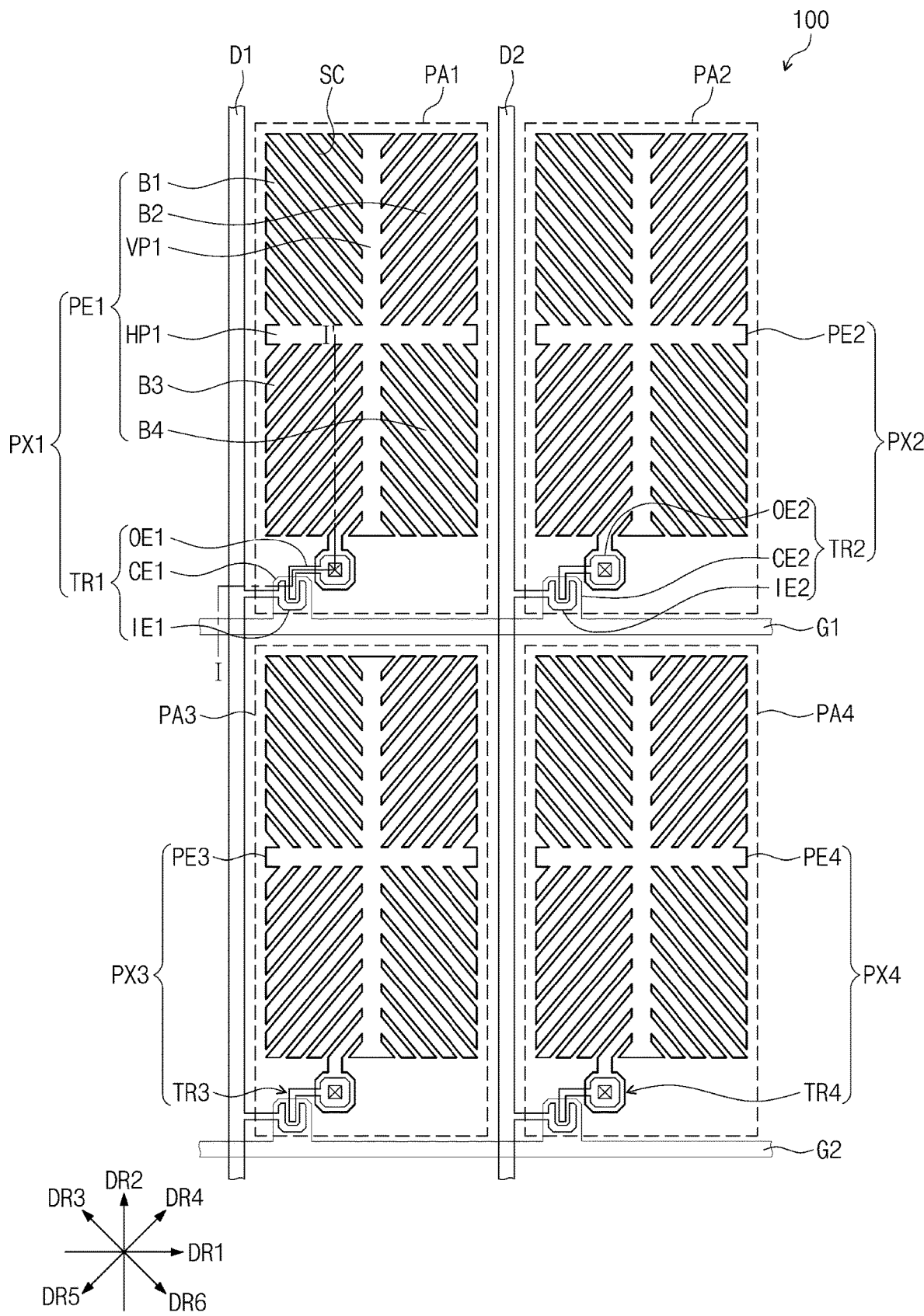
FIG. 3A is a top plan view showing an exemplary embodiment of a display panel.
Figure 3B:
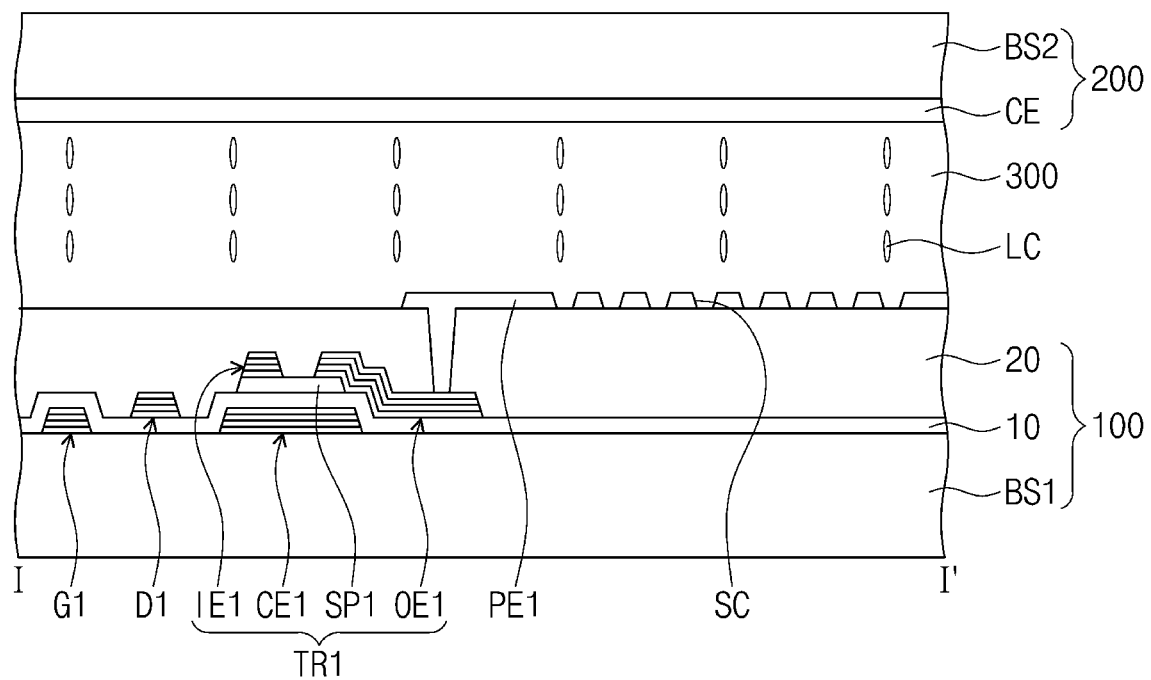
FIG. 3B is an enlarged cross-sectional view taken along line I-I' shown in FIG. 3A.

FIG. 3A is a top plan view showing an exemplary embodiment of a display panel DP. FIG. 3B is an enlarged cross-sectional view taken along line I-I' shown in FIG. 3A. FIG. 3A is a top plan view showing the first substrate 100. For the convenience of explanation, FIG. 3A shows a portion of the first substrate 100, which corresponds to four pixel areas PA1, PA2, PA3, and PA4 adjacent to each other among the pixel areas PA shown in FIG. 2. FIG. 3B shows an enlarged cross-section of the display panel DP. Hereinafter, the present disclosure will be described with reference to FIGS. 3A and 3B.

Four pixels PX1, PX2, PX3, and PX4 may be respectively disposed in the four pixel areas PA1, PA2, PA3, and PA4. Each of the four pixels PX1, PX2, PX3, and PX4 may be connected to a corresponding gate line and a corresponding data line. In detail, among the four pixels PX1, PX2, PX3, and PX4, a first pixel PX1 is connected to a first gate line G1 and a first data line D1, and a second pixel PX2 is connected to the first gate line G1 and a second data line D2. A third pixel PX3 is connected to a second gate line G2 and the first data line D1, and a fourth pixel PX4 is connected to the second gate line G2 and the second data line D2. In the present exemplary embodiment, for the convenience of explanation, one pixel area PA1 (hereinafter, referred to as a "first pixel area PA1") among the four pixel areas PA1, PA2, PA3, and PA4 will be described as a representative example.

The first pixel area PA1 may be the planar area at which light is generated and/or transmitted by the first pixel PX1, such as to display an image. Pixels PX, each having a structure corresponding to that of the first pixel PX1, may be disposed in other pixel areas PA. However, this is merely exemplary, and the pixels PX disposed in other pixel areas PA may have a structure different from the first pixel PX1 and should not be limited to a particular embodiment.

The first pixel PX1 may include a first thin film transistor TR1, a display element connected to the first thin film transistor TR1 and a first capacitor (e.g., first liquid crystal capacitor). The first liquid crystal capacitor may include a collective structure of a first pixel electrode PE1, a common electrode CE, and the liquid crystal layer 300. A display element may include the first pixel electrode PE1, the common electrode CE, and the liquid crystal layer 300 disposed between the first pixel electrode PE1 and the common electrode CE, without being limited thereto.

The first substrate 100 may include a first base substrate BS1 (hereinafter also base substrate BS), the first gate line G1, the second gate line G2, the first data line D1, the second data line D2, the first thin film transistor TR1, a second thin film transistor TR2, a third thin film transistor TR3, a fourth thin film transistor TR4, a plurality of pixel electrodes, and a plurality of insulating layers. The insulating layers include a first insulating layer 10 and a second insulating layer 20.

The first base substrate BS1 may include an insulating material. The first base substrate BS1 may be optically transparent. Accordingly, a light generated and provided from the backlight unit (not shown) disposed under the first base substrate BS1 may reach the liquid crystal layer 300 after passing through the first base substrate BS1. In an exemplary embodiment, for example, the first base substrate BS1 may include a glass substrate or a plastic substrate.

The first gate line G1 and the second gate line G2 are disposed between the first base substrate BS1 and the first insulating layer 10. In a top plan view, the first gate line G1 includes or defines a portion thereof protruded in a direction substantially parallel to the second direction DR2 and may serve as a first control electrode CE1 of the first thin film transistor TR1 and a second control electrode CE2 of the second thin film transistor TR2. The first thin film transistor TR1 is connected to the first gate line G1 at the first control electrode CE1 to receive the gate signal provided from the first gate line G1.

The first insulating layer 10 covers the first gate line G1 and the first control electrode CE1. The first insulating layer 10 may include an organic material (e.g., organic layer) and/or an inorganic material (e.g., inorganic layer).

A first semiconductor pattern SP1 of the first thin film transistor TR1 may be disposed on the first insulating layer 10. The first semiconductor pattern SP1 may be disposed to be spaced apart from the first control electrode CE1 with the first insulating layer 10 interposed therebetween when viewed in a cross-section.

The first semiconductor pattern SP1 may include a semiconductor material. In an exemplary embodiment, for example, the semiconductor material may include at least one of amorphous silicon, polycrystalline silicon, crystalline silicon, oxide semiconductor, and compound semiconductor.

The second insulating layer 20 covers a first input electrode IE1 and a first output electrode OE1 of the first thin film transistor TR1. The second insulating layer 20 also covers a second input electrode IE2 and a second output electrode OE2 of the second thin film transistor TR2. The second insulating layer 20 may include an organic material and/or an inorganic material. The first input electrode IE1, the first output electrode OE1, the second input electrode IE2 and the second output electrode OE1 may be disposed between the first insulating layer 10 and the second insulating layer 20.

The first input electrode IE1 may be defined by a portion of the first data line D1, which protrudes in a direction substantially parallel to the first direction DR1. The first input electrode IE1 and the first output electrode OE1 may be disposed in a same layer as the first data line D1, among material layers disposed on the first base substrate BS1. The second input electrode IE2 may be defined by a portion of the second data line D2, which protrudes in a direction substantially parallel to the first direction DR1. The second input electrode IE2 and the second output electrode OE2 may be disposed in a same layer as the second data line D2, among material layers disposed on the first base substrate BS1.

The first input electrode IE1 may have a shape surrounding a first end (e.g., a distal end) of the first output electrode OE1, when viewed in a top plan view. A second end of the first output electrode OE1 which is opposite to the first end thereof overlaps with or corresponds to a contact hole through which the second end makes contact with the first pixel electrode PE1. That is, the first thin film transistor TR1 is connected to the first pixel electrode PE1 at such contact hole. Each of the first input electrode IE1 and the first output electrode OE1 may be disposed on a same one of the first semiconductor pattern SP1 and may directly make contact with the first semiconductor pattern SP1.

However, this is merely exemplary, and the first input electrode IE1 and the first output electrode OE1 may be disposed spaced apart from the first semiconductor pattern SP1 along a thickness direction by an intervening layer and may make contact with the first semiconductor pattern SP1 at or through a separate contact hole defined in the intervening layer. The first thin film transistor TR1 according to the exemplary embodiment of the present disclosure may have a variety of planar shapes and/or cross-sectional shapes and may not be limited to a particular embodiment.

The third thin film transistor TR3 and the fourth thin film transistor TR4 may have substantially a same structure, configuration, etc. as the first thin film transistor TR1 and the second thin film transistor TR2 described above, without being limited thereto.

Referring to FIG. 3B, for example, at least one of the gate lines G1 and G2 and the data lines D1 and D2 may include a plurality of layers stacked one on another along a thickness direction (e.g., vertical direction in FIG. 3B). In the present exemplary embodiment, the gate lines G1 and G2 have a structure in which four layers are stacked one on another. Each of the gate lines G1 and G2 may include a side surface inclined with respect to the first base substrate BS1 when viewed in a cross-section.

Referring again to FIG. 3B, the data lines D1 and D2 have a structure in which four layers are stacked one on another. Each of the data lines D1 and D2 may include a side surface inclined with respect to the first base substrate BS1 when viewed in a cross-section. The data lines D1 and D2 have the structure corresponding to the gate lines G1 and G2. That is, the data lines D1 and D2 and the gate lines G1 and G2 have a same structure including four layers stacked one on another.

In the present exemplary embodiment, the first control electrode CE1 may be branched from the first gate line G1 and may have substantially a same cross-sectional layer structure as the first gate line G1. The first input electrode IE1 may be branched from the first data line D1 and may have substantially a same cross-sectional layer structure as the first data line D1.

The data lines D1 and D2 may have a different cross-sectional layer structure from that of the gate lines G1 and G2. In an exemplary embodiment, for example, one group of signal lines among the gate lines G1 and G2 as a first group and the data lines D1 and D2 as a second group may have a multi-layer structure, and the other group among the gate lines G1 and G2 as the first group and the data lines D1 and D2 as the second group may have a single-layer structure. As another example, one among the gate lines G1 and G2 and the data lines D1 and D2 may have an n-layer structure (n is a natural number), and the other among the gate lines G1 and G2 and the data lines D1 and D2 may have an m-layer structure (m is a natural number different from n). According to the present disclosure, the external light reflectance of the display panel DP may be easily reduced by controlling at least one layer structure of the groups of signal lines among the gate lines G1 and G2 as one group and the data lines D1 and D2 as a different group. This will be described in detail later.

The first pixel electrode PE1 is disposed on the second insulating layer 20. The first pixel electrode PE1 and a second pixel electrode PE2 may be disposed to be spaced apart from each other along the first direction DR1 with the second data line D2 interposed therebetween. A third pixel electrode PE3 and a fourth pixel electrode PE4 may be disposed to be spaced apart from the first pixel electrode PE1 and the second pixel electrode PE2, respectively, along the second direction DR2, with the first gate line G1 interposed therebetween.

The first pixel electrode PE1 is connected to the first thin film transistor TR1 at a contact hole defined in the second insulating layer 20. Referring to FIG. 3B, for example, a portion of the first pixel electrode PE1 extends into and through the second insulating layer 20 at the contact hole therein, to be connected to the first output electrode OE1 at the contact hole. The first pixel electrode PE1 may receive a voltage as an electrical signal which output from the first thin film transistor TR1.

Referring to FIG. 3A, the first pixel electrode PE1 may include a first vertical portion VP1, a first horizontal portion HP1 crossing the first vertical portion VP1, and a plurality of branch portions B1 to B4. The first vertical portion VP1, the first horizontal portion HP1, and the branch portions B1 to B4 are connected to each other to form the first pixel electrode PE1 in a single unitary form.

The first vertical portion VP1 lengthwise extends along the second direction DR2. The first vertical portion VP1 may lengthwise extend in a direction substantially parallel to the first data line D1 and the second data line D2.

The first horizontal portion HP1 is connected to the first vertical portion VP1. The first horizontal portion HP1 lengthwise extends along the first direction DR1. The first horizontal portion HP1 may be connected to the first vertical portion VP1 while crossing the first vertical portion VP1. In the present exemplary embodiment, the first vertical portion VP1 and the first horizontal portion HP1 are shown as being intersected at a center of each other. However, this is merely exemplary, and the first horizontal portion HP1 may be disposed to be closer to one end of the first vertical portion VP1 with respect to the center of a length of the first vertical portion VP1, or the first vertical portion VP1 may be disposed to be closer to one end of the first horizontal portion HP1 with respect to the center of a length of the first horizontal portion HP1.

The branch portions B1 to B4 are connected to the first horizontal portion HP1 and/or or the first vertical portion VP1. Each single one branch portion among the branch portions B1 to B4 may lengthwise extend in a direction inclined with respect to the first direction DR1 and/or the second direction DR2.

Each single one of the branch portions B1 to B4 may lengthwise extend from the first horizontal portion HP1 and/or the first vertical portion VP1 in a radial form. The branch portions may be divided into groups of branch portions depending on a direction along which lengths thereof extend from the first horizontal portion HP1 and/or the first vertical portion VP1.

In an exemplary embodiment, for example, the branch portions B1 to B4 may be divided into a first branch portion B1 provided in plural (e.g., first branch portions B1), a second branch portion B2 provided in plural (e.g., second branch portions B2), a third branch portion B3 provided in plural (e.g., third branch portions B3) and a fourth branch portion B4 provided in plural (e.g., fourth branch portions B4). A slit SC may be respectively provided or formed between adjacent branch portions within each group of branch portions among the first to fourth branch portions B1 to B4. The slit SC may be provided in plural (e.g., slits SC) which respectively correspond to distances between adjacent branch portions within each group of branch portions among the first to fourth branch portions B1 to B4.

The first branch portions B1 lengthwise extend along a third direction DR3 from the first horizontal portion HP1 and/or the first vertical portion VP1. The first branch portions B1 may be patterns arranged along a direction substantially parallel to a fourth direction DR4 to be spaced apart from each other along the fourth direction DR4.

The second branch portions B2 lengthwise extend along the fourth direction DR4 from the first horizontal portion HP1 and/or the first vertical portion VP1. The second branch portions B2 may be patterns arranged along a direction substantially parallel to the third direction DR3 to be spaced apart from each other along the third direction DR3.

The third branch portions B3 extend along a fifth direction DR5 from the first horizontal portion HP1 and/or the first vertical portion VP1. The third branch portions B3 may be patterns arranged along a direction substantially parallel to the third direction DR3 to be spaced apart from each other along the third direction DR3.

The fifth direction DR5 may be a direction opposite to the fourth direction DR4. Accordingly, the third branch portions B3 may lengthwise extend along a direction substantially parallel to lengths of the second branch portions B2.

The fourth branch portions B4 lengthwise extend along a sixth direction DR6 from the first horizontal portion HP1 and/or the first vertical portion VP1. The fourth branch portions B4 may be patterns arranged along a direction substantially parallel to the fourth direction DR4 to be spaced apart from each other along the fourth direction DR4.

The sixth direction DR6 may be a direction opposite to the third direction DR3. Accordingly, the fourth branch portions B4 may lengthwise extend in a direction substantially parallel to lengths of the first branch portions B1.

As the first pixel electrode PE1 includes the branch portions B1 to B4, the first pixel electrode PE1 may display a plurality of grayscales in a single one of the pixel area PA. In detail, the planar area in which the first branch portions B1 are arranged, the planar area in which the second branch portions B2 are arranged, the planar area in which the third branch portions B3 are arranged, and the planar area in which the fourth branch portions B4 are arranged may be defined as a plurality of domains distinguished from each other.

The alignment of the liquid crystal molecules LC of the liquid crystal layer 300 may be changed depending on the extension directions (e.g., lengths) of branch portions B1 to B4. Therefore, the display panel DP may display various grayscales through the domains in the single one of the pixel area PA, and as a result, the display panel DP may display the image having improved color reproducibility. In addition, the display device DS having high resolution may be implemented.

Referring to FIG. 3B again, the second substrate 200 includes a second base substrate BS2 and the common electrode CE. The second base substrate BS2 may be an insulating substrate that is optically transparent.

The common electrode CE forms an electric field with the first pixel electrode PE1. The common electrode CE overlaps with each of the pixel electrodes PE1, PE2, PE3, and PE4. That is, a single one of the common electrode CE may correspond to each of the pixel electrodes PE1, PE2, PE3, and PE4 to be disposed commonly therewith. Each of the pixel electrodes PE1, PE2, PE3, and PE4 forms a liquid crystal capacitor with the common electrode CE and the liquid crystal layer 300.

Although not shown in figures, the display panel DP may further include a plurality of alignment layers. The alignment layers may be respectively disposed between the liquid crystal layer 300 and the second insulating layer 20 and between the liquid crystal layer 300 and the common electrode CE. Each of the alignment layers may control an initial alignment of the liquid crystal molecules LC.

Figure 4A:
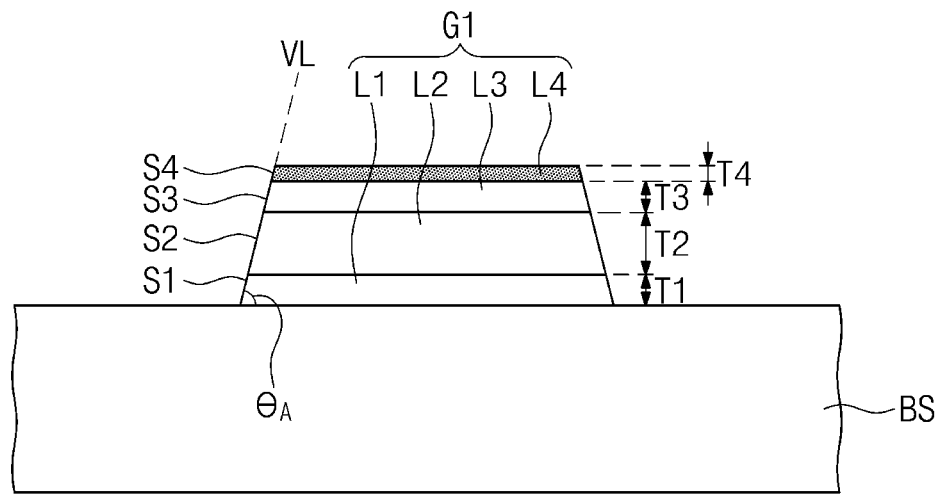
FIG. 4A is an enlarged cross-sectional view showing an exemplary embodiment of a portion of a display panel.
Figure 4B:
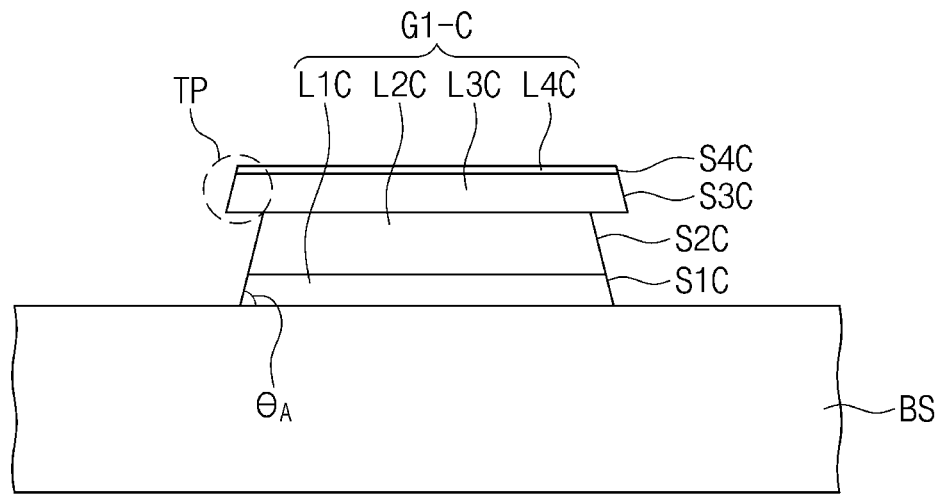
FIG. 4B is an enlarged cross-sectional view showing a portion of a comparative embodiment of a display panel.
Figure 4C:
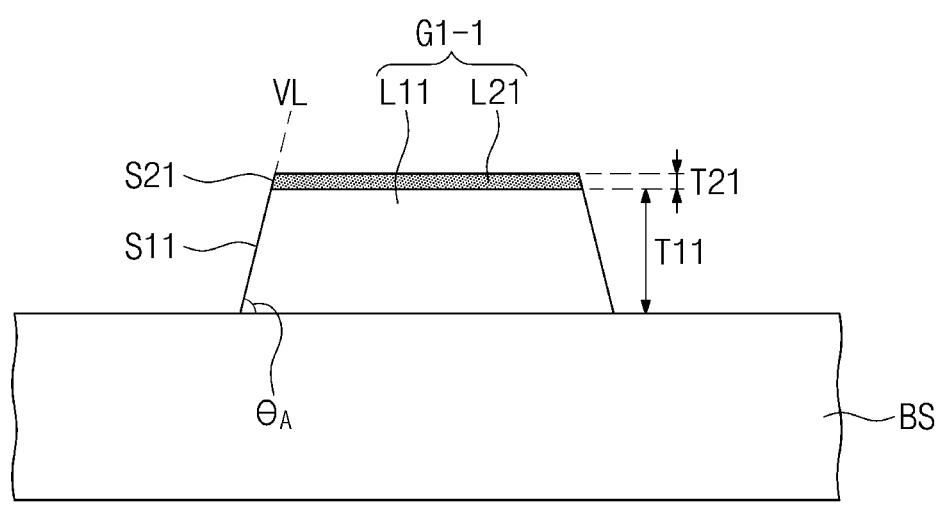
FIG. 4C is an enlarged cross-sectional view showing an exemplary embodiment of a portion of a display panel.

FIG. 4A is an enlarged cross-sectional view showing an exemplary embodiment of a signal line of the display panel DP. FIG. 4B is an enlarged cross-sectional view showing a signal line of a comparative display panel. FIG. 4A shows an enlarged cross-section of the first gate line G1 shown in FIG. 3B, and FIG. 4B shows an enlarged cross-section of a comparative first gate line G1-C. FIG. 4C shows a modified exemplary embodiment of a signal line of the display panel DP.

Hereinafter, the present disclosure will be described with reference to FIGS. 4A and 4C. In FIGS. 4A to 4C, the same reference numerals denote the same element in FIGS. 1 to 3B, and thus detailed descriptions of the same elements will be omitted.

Referring to FIG. 4A, the first gate line G1 may include a first layer L1, a second layer L2, a third layer L3, and a fourth layer (e.g., first, second, third, and fourth layers L1, L2, L3, and L4). The first, second, third, and fourth layers L1, L2, L3, and L4 may be sequentially stacked along a thickness direction of a base substrate BS (refer to first base substrate BS1 in FIG. 3A). The fourth layer L4 may define an upper layer while a collection of one or more of the first, second and third layers L1, L2 and L3 defines a lower layer. In an exemplary embodiment, the upper layer is in direct contact with the lower layer. As being in "direct contact," layers may form an interface therebetween.

The first layer L1 may include metal. In an exemplary embodiment, for example, the first layer L1 may include titanium, molybdenum, tungsten, or a combination thereof. The first layer L1 may have an adhesive strength with respect to the second layer L2, which is higher than an adhesive strength with respect to the base substrate BS. The first layer L1 has a first thickness T1. In the present exemplary embodiment, where the first layer L1 includes titanium (Ti), the first thickness T1 may be designed to have a range equal to or greater than about 50 angstroms and equal to or smaller than about 500 angstroms.

The second layer L2 may include metal. The second layer L2 may have a specific resistance which is lower than a specific resistance of the first layer L1. As the specific resistance of the second layer L2 decreases, a resistance of the first gate line G1 may be reduced. The second layer L2 has a second thickness T2. The second thickness T2 of the second layer L2 may be greater than the first thickness T1 of the first layer L1. As the second thickness T2 increases, the resistance of the first gate line G1 may be reduced. In the present exemplary embodiment, where the second layer L2 includes copper (Cu), the second thickness T2 may be designed to have a range equal to or greater than about 1,000 angstroms and equal to or smaller than about 20,000 angstroms.

The third layer L3 may include metal. The third layer L3 may cover an upper surface of the second layer L2. The third layer L3 may have a reflectance which is lower than a reflectance of the second layer L2. An amount of light reflected from the upper surface of the second layer L2 may be larger than an amount of light reflected by a stacked structure of a lower layer as including both the second layer L2 and the third layer L3.

The third layer L3 may have a specific resistance higher than a specific resistance of the second layer L2. The third layer L3 may have a third thickness T3. In the present exemplary embodiment, where the third layer L3 includes titanium (Ti), the third thickness T3 may be designed to have a range equal to or greater than about 100 angstroms and equal to or smaller than about 500 angstroms.

The fourth layer L4 may cover the third layer L3. The fourth layer L1 may define an upper surface of the first gate line G1. The fourth layer L4 may include metal or metal oxide. In an exemplary embodiment, for example, the fourth layer L4 may include molybdenum oxide (MoOx), copper oxide (CuO), niobium oxide (NbOx), tantalum oxide (TaOx), molybdenum (Mo), tantalum (Ta), niobium (Nb), nickel (Ni), zinc (Zn), copper (Cu), or combinations thereof.

The fourth layer L4 may have a reflectance lower than the reflectance of the second layer L2. The fourth layer L4 may have a fourth thickness T4. The reflectance of the fourth layer L4 may be controlled or defined by the material of the fourth layer L4 and the fourth thickness T4 of the fourth layer L4. In an exemplary embodiment, for example, the fourth layer L4 may include a conductive material which is opaque. In the present exemplary embodiment, where the fourth layer L4 includes copper (Cu), the fourth thickness T4 may be designed to have a value equal to or smaller than about 100 angstroms.

As another example, the fourth layer L4 may include a conductive material which is transparent. In an exemplary embodiment, for example, the fourth layer L4 may include a transparent conductive oxide ("TCO"). The fourth layer L4 may define a relatively low reflectance even though the fourth thickness T4 is designed to have a value equal to or greater than about 100 angstroms.

In an exemplary embodiment, the first, second, and third layers L1, L2, and L3 as a lower layer may each include a different material from the upper layer (e.g., fourth layer L4), without being limited thereto.

A an etch rate of a predetermined etchant with respect to the fourth layer L4 may be in a range equal to or greater than about 0.5 times and equal to or smaller than about 3 times the etch rate of the predetermined etchant with respect to the first, second, and third layers L1, L2, and L3. That is, the fourth layer L4 may include a material having an etch selectivity in a range equal to or greater than about 0.5 and equal to or smaller than about 3 as compared with the first, second, and third layers L1, L2, and L3 with respect to the same etchant. In the present disclosure, the etch selectivity may be set to the etch rate ratio such as thickness per second, or angstroms per second (angstroms/s or Å/s).

The predetermined etchant may be provided in various forms. In the present exemplary embodiment, the etchant may include a non-aqueous based solvent.

The first gate line G1 may include an inclined side surface when viewed in a cross-section. The side surface of the first gate line G1 may be defined by a collection of side surfaces S1, S2, S3, and S4 (hereinafter, referred to as first, second, third, and fourth side surfaces S1, S2, S3, and S4) of the first, second, third, and fourth layers L1, L2, L3, and L4, respectively. The first, second, third, and fourth side surfaces S1, S2, S3, and S4 may be aligned along a virtual line VL inclined at a predetermined angle $\theta_A$ with respect to the upper surface of the base substrate BS. The first, second, third, and fourth side surfaces S1, S2, S3, and S4 may be coplanar with each other to define the inclined side surface of the first gate line G1.

Referring to FIG. 4B, the comparative first gate line G1-C may include comparative first, second, third, and fourth layers L1C, L2C, L3C, and L4C. The comparative first, second, third, and fourth layers L1C, L2C, L3C, and L4C are sequentially stacked along the thickness direction of the base substrate BS. In FIG. 4B, the comparative first, second, and third layers L1C, L2C, and L3C may correspond to the first, second, and third layers L1, L2, and L3 according to one or more exemplary embodiment of the present disclosure, and the comparative fourth layer L4C may be different from the fourth layer L4 according to one or more exemplary embodiment of the present disclosure. A side surface of the comparative first gate line G1-C may be defined by comparative side surfaces S1C, S2C, S3C, and S4C (hereinafter, referred to as comparative first, second, third, and fourth side surfaces S1C, S2C, S3C, and S4C) of the comparative first, second, third, and fourth layers L1C, L2C, L3C, and L4C.

The comparative first gate line G1-C may further include a tip portion TP as compared with the first gate line G1 according to one or more exemplary embodiment of the present disclosure. The tip portion TP may be provided or formed as a protrusion of the comparative third layer L3C and the comparative fourth layer L4C defining the comparative third and fourth side surfaces S3C and S4C, relative to the comparative first and second side surfaces S1C and S2C. The comparative third layer L3C and the comparative fourth layer L4C may each extend further than the comparative first and second side surfaces S1C and S2C to define the tip portion TP.

In the comparative first gate line G1-C, the comparative fourth layer L4C may be an oxide of the comparative third layer L3C. For example, when the comparative third layer L3C includes titanium, the comparative fourth layer L4C may include titanium oxide TiOx. The comparative fourth layer L4C may be provided or formed when the material for forming the comparative third layer L3C is oxidized in a process of providing or forming the comparative first gate line G1-C. That is, in the comparative first gate line G1-C, the comparative first, second, and third layers L1C, L2C, and L3C may correspond to a previously designed structure, and the comparative fourth layer L4C may be a by-product generated during a process, e.g., a deposition or etching process.

The comparative fourth layer L4C may have a relatively lower etch rate than the comparative first, second, and third layers L1C, L2C, and L3C with respect to a same etchant. The comparative third layer L3C may be protected from the etchant by the comparative fourth layer L4C. Accordingly, the tip portion TP may be formed in the comparative first gate line G1-C due to a difference in etch rate between the comparative first and second layers L1C and L2C and the comparative third and fourth layers L3C and L4C during the etching process.

The tip portion TP may act as a defect that locally causes a damage to the first insulating layer 10 (refer to FIG. 3B) or the second insulating layer 20 (refer FIG. 3B), which are provided or formed thereafter. The first insulating layer 10 or the second insulating layer 20 may be disconnected or broken by the tip portion TP. Accordingly, the process reliability of the display panel DP (refer to FIG. 1) may be deteriorated.

According to the present disclosure, since the fourth layer L4 is intentionally and additionally provided or formed when the first gate line G1 is formed, in comparison with the comparative fourth layer L4C being a by-product generated during a manufacturing process of the comparative first gate line G1-C, a formation of the oxide layer like the comparative fourth layer L4C, which is formed on the comparative third layer L3, may be reduced or effectively prevented. Therefore, the side surfaces S1, S2, S3, and S4 may be provided or formed at a uniform angle $\theta_A$ in the etching process of the first gate line G1, and thus a formation of the tip portion TP may be inhibited. As a result, the process reliability of the display panel DP may be improved.

As shown in FIG. 4C, an exemplary embodiment of a first gate line G1-1 may include two layers L11 and L21, which is less than four layers included in the first gate line G1. A first layer L11 may include a conductive material. The first layer L11 has a first thickness T11 and a first side surface S11.

A second layer L21 is directly disposed on the first layer L11. The second layer L21 includes a conductive material. The second layer L21 has a second thickness T21 and a second side surface S21.

The first side surface S11 and the second side surface S21 may be connected to each other with a continuity along a virtual line VL inclined at a predetermined angle $\theta_A$ with respect to an upper surface of the base substrate BS. The first side surface S11 and the second side surface S21 may be coplanar with each other.

In the present exemplary embodiment, the second layer L21 may be designed to have an etch rate in a range equal to or greater than about 0.5 times and equal to or smaller than about 3 times the etch rate of the first layer L11 with respect to a same etchant. In detail, a material for the second layer L21 may have an etch selectivity within a range of about 0.5 to about 3 a material for the first layer L11 with respect to a specific etchant. As a difference in etch rate between the first layer L11 and the second layer L21 decreases, a formation of the tip portion TP may be easily inhibited.

According to the present disclosure, where the first gate line G1 has the structure in which the plural layers are sequentially stacked, an uppermost layer is formed of a material having the etch rate in the range equal to or greater than about 0.5 times and equal to or smaller than about 3 times the etch rate of lower layers under the uppermost layer with respect to the predetermined etchant, and thus the difference in etch rate between the uppermost layer and the lower layers may be reduced. Therefore, occurrence of the process defects such as the tip portion TP may be reduced or effectively prevented, and the process reliability of the display panel DP may be improved.

Figure 5:
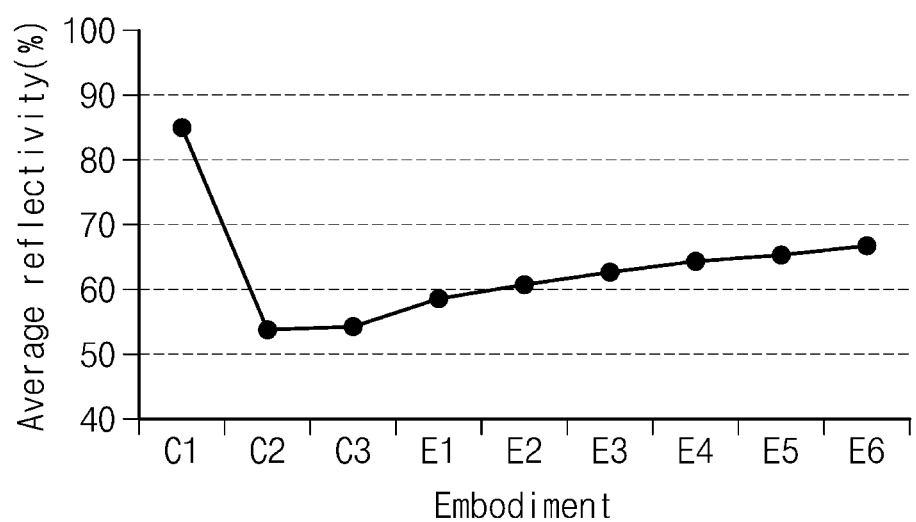
FIG. 5 is a graph showing a light reflectance of exemplary embodiments of a display panel.

FIG. 5 is a graph showing the light reflectance of embodiments. FIG. 5 shows an average external light reflectance in percent (%) of comparative embodiments C1, C2, and C3 and exemplary embodiments E1, E2, E3, E4, E5, and E6 of the present disclosure. Hereinafter, the present disclosure will be described with reference to FIG. 5.

The comparative embodiments C1, C2, and C3 may include first, second, and third comparative embodiments C1, C2, and C3. The first comparative embodiment C1 relates to the comparative embodiment having a stacked structure of a single lower layer, which includes copper and has a thickness of about 6,000 angstroms, and an uppermost layer, which includes titanium and has a thickness of about 200 angstroms. The second comparative embodiment C2 relates to the comparative embodiment having a structure of a single layer, which includes titanium and has a thickness of about 1,000 angstroms. The third comparative embodiment C3 relates to the comparative embodiment having a stacked structure of a double lower layer, which includes a layer including titanium and having a thickness of about 250 angstroms and a layer including copper and having a thickness of about 6,000 angstroms, and an uppermost layer, which includes titanium and has a thickness of about 200 angstroms.

In the comparative embodiments C1, C2, and C3, the single lower layer including only copper has an etch rate of about 150 angstroms/s, and the single layer including only titanium has an etch rate of about 3.3 angstroms/s. However, in the third comparative embodiment C3 having the structure of titanium/copper/titanium, the etch rate of the uppermost titanium layer may be about 3.3 angstroms/s, and the etch rate of the lower titanium layer may be about 25 angstroms/s. As an oxide layer is formed on titanium which is highly reactive with oxygen, the uppermost titanium layer has a relatively low etch rate as compared with the lower titanium layer on which the oxide layer is not formed. In the third comparative embodiment C3, the lower layer having the stacked structure of copper/titanium except the uppermost titanium layer has an etch rate of about 130 angstroms/s. Accordingly, the etch rate of the uppermost layer including titanium is about 0.022 times in the first comparative embodiment C1 and about 0.025 times in the third comparative embodiment C3, relative to the etch rate of the lower layer and does not satisfy the range equal to or greater than about 0.5 and equal to or smaller than about 3.

The exemplary embodiments E1, E2, E3, E4, E5, and E6 of the present disclosure may include first, second, third, fourth, fifth, and sixth exemplary embodiments E1, E2, E3, E4, E5, and E6. Each of the first, second, third, fourth, fifth, and sixth exemplary embodiments E1, E2, E3, E4, E5, and E6 has a structure corresponding to the first gate line G1 (refer to FIG. 4A) shown in FIG. 4A, and only uppermost layers thereof corresponding to the fourth layer L4 (refer to FIG. 4A) have different thicknesses from each other. In each of the first, second, third, fourth, fifth, and sixth exemplary embodiments E1, E2, E3, E4, E5, and E6, the first, second, and third layers L1, L2, and L3 (refer to FIG. 4A) may correspond to the third comparative embodiment C3. That is, the first, second, third, fourth, fifth, and sixth embodiments E1, E2, E3, E4, E5, and E6 may be provided with the fourth layer L4 added thereto.

In detail, the first embodiment E1 may be an embodiment including a lower layer in which a layer including titanium and having a thickness of about 250 angstroms, a layer including copper and having a thickness of about 6,000 angstroms, and a layer including titanium and having a thickness of about 200 angstroms are sequentially stacked and an uppermost layer directly disposed on the lower layer, including copper, and having a thickness 20 angstroms. The second embodiment E2 may be an embodiment in which the uppermost layer of the first embodiment E1 is replaced with a copper layer having a thickness of about 30 angstroms. The third embodiment E3 may be an embodiment in which the uppermost layer of the first embodiment E1 is replaced with a copper layer having a thickness of about 40 angstroms. The copper has an etch rate of about 150 angstroms/s, and the lower layer having the stacked structure of titanium/copper/titanium has an etch rate of about 115 angstroms/s. Accordingly, an etch selectivity of the uppermost layer including copper with respect to the lower layer is about 1.30 that satisfies the range equal to or greater than about 0.5 and equal to or smaller than about 3.

The fourth embodiment E4 may be an embodiment in which the uppermost layer of the first embodiment E1 is replaced with a copper layer having a thickness of about 50 angstroms. The fifth embodiment E5 may be an embodiment in which the uppermost layer of the first embodiment E1 is replaced with a copper layer having a thickness of about 60 angstroms. The sixth embodiment E6 may be an embodiment in which the uppermost layer of the first embodiment E1 is replaced with a copper layer having a thickness of about 70 angstroms.

The graph shown in FIG. 5 shows a relative external light reflectance of each of the embodiments C1, C2, C3, E1, E2, E3, E4, E5, and E6 when assuming that the external light reflectance of a single layer including aluminum is about 100% and shows average values. Hereinafter, the present disclosure will be described with reference to FIG. 5.

As shown in FIG. 5, the first, second, third, fourth, fifth, and sixth embodiments E1, E2, E3, E4, E5, and E6 may have a relatively low reflectance as compared with the first comparative embodiment C1 among the comparative embodiments C1, C2, and C3 and may have a low reflectance close to a half of the external light reflectance of aluminum (100% in FIG. 5). The first, second, third, fourth, fifth, and sixth embodiments E1, E2, E3, E4, E5, and E6 may have a relatively high reflectance as compared with the second and third comparative embodiments C2 and C3 among the comparative embodiments C1, C2, and C3.

Since the second comparative embodiment C2 has the lowest reflectance but has a single layer including titanium, the second comparative embodiment C2 may have a relatively high specific resistance as compared with other embodiments including copper. Accordingly, electrical characteristics of the display panel DP including a structure of second comparative embodiment C2 may be degraded as having a relatively higher specific resistance as compared with the first, second, third, fourth, fifth, and sixth embodiments E1, E2, E3, E4, E5, and E6.

The third comparative embodiment C3 may have a relatively low reflectance as compared with the first, second, third, fourth, fifth, and sixth embodiments E1, E2, E3, E4, E5, and E6. The third comparative embodiment C3 may substantially correspond to the comparative first gate line G1-C shown in FIG. 4B. That is, the third comparative embodiment C3 may have the relatively low reflectance. However, there is a high possibility that the defect such as the tip portion TP (refer to FIG. 4B) is generated during a process of forming the third comparative embodiment C3, and the process reliability of a display panel DP including a structure of the third comparative embodiment C3 is deteriorated.

As described above, in the first, second, third, fourth, fifth, and sixth embodiments E1, E2, E3, E4, E5, and E6, the possibility of the oxide layer formation in the process is relatively low. In addition, a ratio of the etch rate of the uppermost layer over the lower layer may be maintained within a predetermined range. Thus, a defect like the formation of the tip portion TP due to the difference in etch rate between the uppermost layer and the lower layer may be reduced or effectively prevented.

In addition, the external light reflectance of the first, second, third, fourth, fifth, and sixth embodiments E1, E2, E3, E4, E5, and E6 is relatively larger than that of the third comparative embodiment C3, but differences in the external light reflectance between the first to sixth embodiments E1 to E6 and the third comparative embodiment C3 are not large, and the external light reflectance of the first to sixth embodiments E1 to E6 are greatly reduced as compared with the embodiment including only aluminum or the first comparative embodiment C1.

According to one or more exemplary embodiment of the present disclosure, the display panel DP including a conductive structure (e.g., signal line, electrode, electronic element) that has the specific resistance similar to the first comparative embodiment C1 or the third comparative embodiment C3, has the light reflectance lower than the first comparative embodiment C1, and has improved process reliability as compared with the third comparative embodiment C3 may be provided. Thus, the external light reflectance of the display panel DP may be reduced, and the visibility of the display panel DP may be improved. In addition, a process yield in providing the display panel DP may be improved, and a manufacturing cost of the display panel DP may be reduced.

Figure 6:
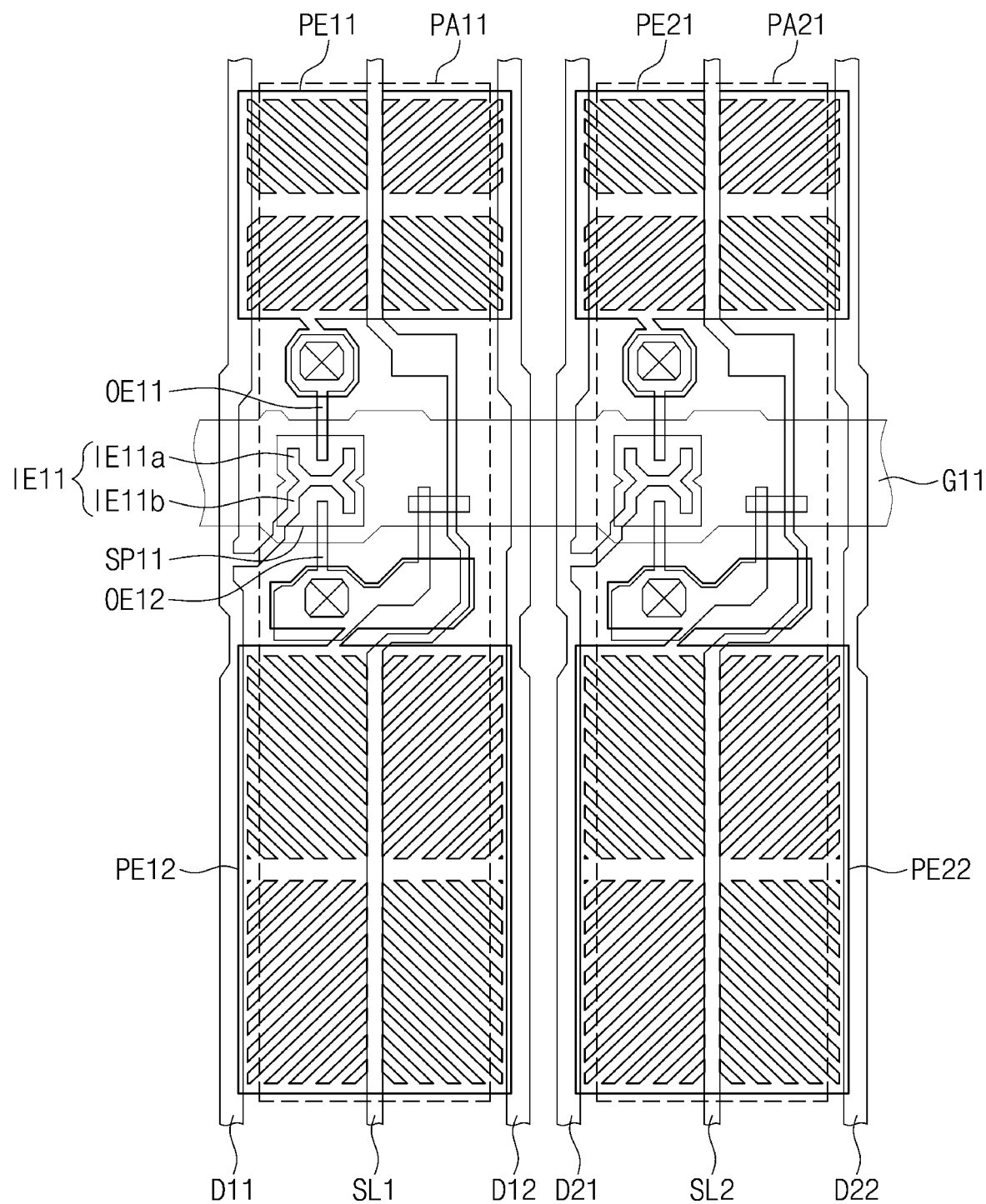
FIG. 6 is a top plan view showing an exemplary embodiment of a display panel.

FIG. 6 is a top plan view showing a portion of a display panel according to an exemplary embodiment of the present disclosure. FIG. 6 is a plan view showing an area in which a first pixel area PA11 and a second pixel area PA21 are arranged in the first substrate 100 (refer to FIG. 3B). Hereinafter, the present disclosure will be described with reference to FIG. 6. In FIG. 6, the same reference numerals denote the same elements in FIGS. 1 to 5, and thus detailed descriptions of the same elements will be omitted.

Referring to FIG. 6, the first pixel area PA11 may be disposed between two data lines D11 and D12, and one gate line G11 may cross the first pixel area PA11. Two pixel electrodes PE11 and PE12 and two thin film transistors may be arranged in the first pixel area PA11.

A first semiconductor pattern SP11 is disposed in the first pixel area PA11 and overlaps with the first gate line G11. A portion of the first gate line G11, which overlaps with the first semiconductor pattern SP11, may correspond to the first control electrode CE1 (refer to FIG. 3A) of the thin film transistor.

An input electrode Iii branched from a first data line D11 extends to overlap with the first semiconductor pattern SP11. The input electrode IE11 may include a first input electrode IE11a having a shape surrounding a portion of a first output electrode OE11 and a second input electrode IE11b having a shape surrounding a portion of a second output electrode OE12.

A portion of the first gate line G11, a portion of the first semiconductor pattern SP11, the first input electrode IE11a, and the first output electrode OE11 may form one thin film transistor to control a first sub-pixel electrode PE11. A portion of the first gate line G11, a portion of the first semiconductor pattern SP11, the second input electrode IE11b, and the second output electrode OE12 may form one thin film transistor to control a second sub-pixel electrode PE12.

According to the present disclosure, the two thin film transistors disposed in the first pixel area PA11 may be connected to one gate line G11 and one data line D11 and may control a voltage of the first and second sub-pixel electrodes PE11 and PE12 distinguished from each other. Similarly, a third sub-pixel electrode PE21 and a fourth sub-pixel electrode PE22, which are disposed in the second pixel area PA21, may be respectively controlled by thin film transistors connected to one gate line G11 and one data line D21.

However, this is merely exemplary, and the first and second pixel areas PA11 and PA21 according to the exemplary embodiment of the present disclosure may have a variety of pixel structures and should not be particularly limited.

In the present exemplary embodiment, signal lines D11, D12, D21, D22, SL1, and SL2 may overlap with at least a portion of the sub-pixel electrodes PE11, PE12, PE21, and PE22. For example, the first data line D11, the second data line D12, and a first conductive line SL1 may be disposed to overlap with the first sub-pixel electrode PE11 and the second sub-pixel electrode PE12. As another example, a third data line D21, a fourth data line D22, and a second conductive line SL2 may be disposed to overlap with the third sub-pixel electrode PE21 and the fourth sub-pixel electrode PE22.

According to the present disclosure, at least one of the signal lines D11, D12, D21, D22, SL1, and SL2 may have a structure substantially corresponding to the first gate lines G1 and G1-1 respectively shown in FIGS. 4A and 4C. That is, at least one of the signal lines D11, D12, D21, D22, SL1, and SL2 may have the structure that includes the lower layer and the uppermost layer having the etch selectivity in the range equal to or greater than about 0.5 and equal to or smaller than about 3 as compared with the lower layer with respect to the predetermined etchant.

Thus, even though the signal lines D11, D12, D21, D22, SL1, and SL2 are disposed at positions where they overlap with the sub-pixel electrodes PE11, PE12, PE21, and PE22 and are visible to the user, the visibility of the signal lines D11, D12, D21, D22, SL1, and SL2 may be reduced since the signal lines D11, D12, D21, D22, SL1, and SL2 have the low reflectance with respect to the external light. In addition, since the signal lines D11, D12, D21, D22, SL1, and SL2 include the uppermost layer with the etch selectivity that is not greater than the lower layer, the improved process reliability may be secured.

Figure 7A:
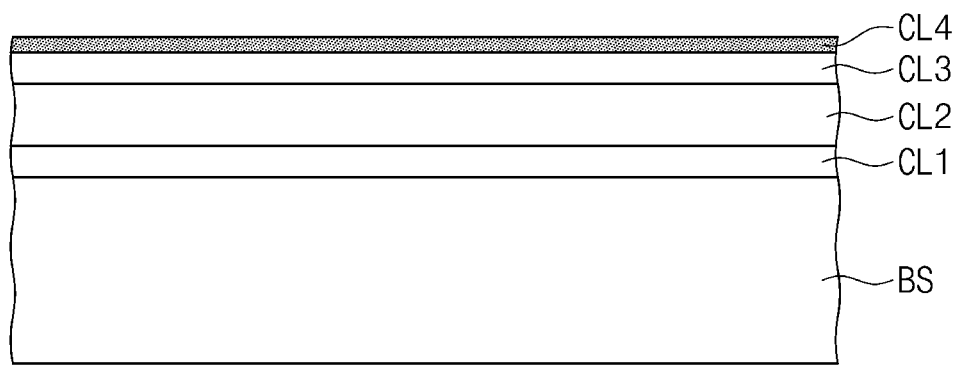
FIGS. 7A to 7C are enlarged cross-sectional views showing an exemplary embodiment of a method of manufacturing a display panel.
Figure 7B:
Figure 7B:
Figure 7B:
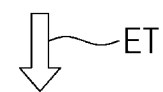
Figure 7B:
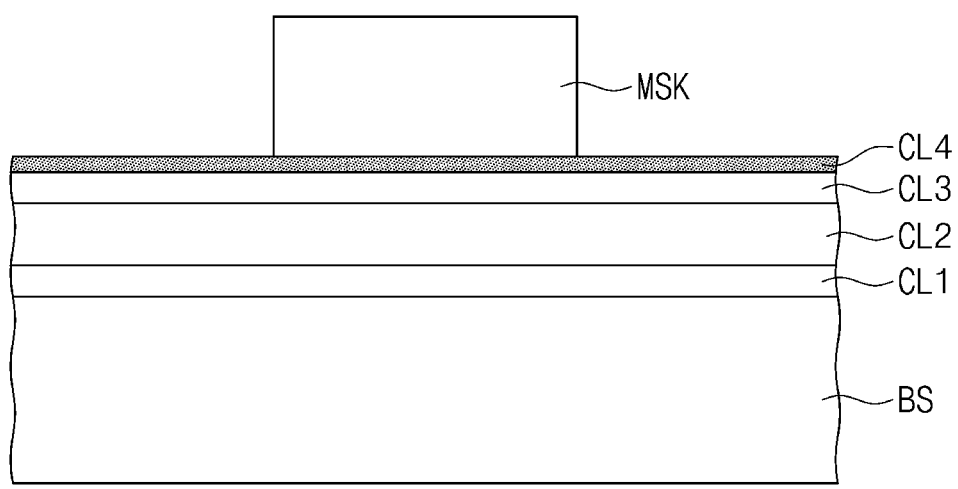
Figure 7C:
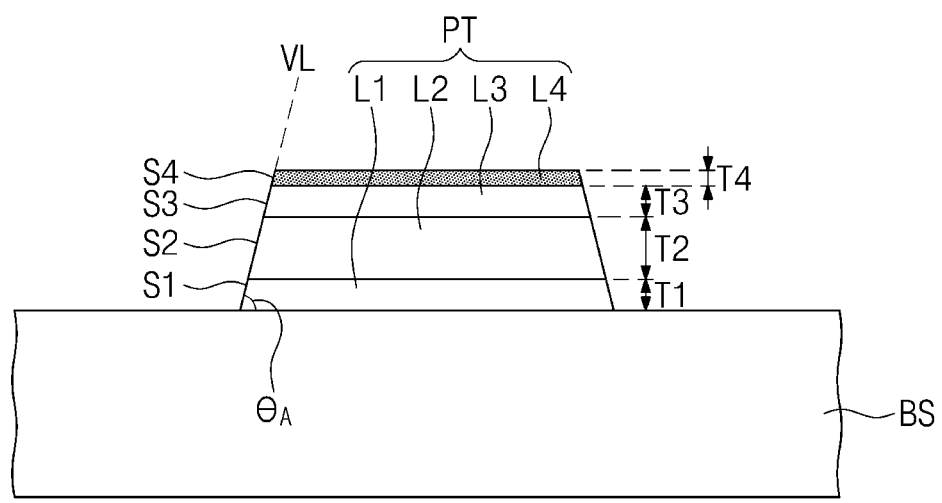

FIGS. 7A to 7C are cross-sectional views showing a method of manufacturing a display panel according to an exemplary embodiment of the present disclosure. The present disclosure will be described with reference to FIGS. 7A to 7C. In FIGS. 7A to 7C, the same reference numerals denote the same elements in FIGS. 1 to 6, and thus detailed descriptions of the same elements will be omitted.

Referring to FIG. 7A, first, second, third, and fourth conductive layers CL1, CL2, CL3, and CL4 are sequentially stacked on the base substrate BS. The first, second, third, and fourth conductive layers CL1, CL2, CL3, and CL4 may be formed through a deposition or coating process. The first, second, third, and fourth conductive layers CL1, CL2, CL3, and CL4 may be formed through successive processes.

Then, referring to FIGS. 7B and 7C, the first, second, third, and fourth conductive layers CL1, CL2, CL3, and CL4 may be patterned to form a predetermined pattern PT. The pattern PT may correspond to the first gate line G1 shown in FIG. 4A.

The first, second, third, and fourth conductive layers CL1, CL2, CL3, and CL4 may be patterned through an etching process. A predetermined mask MSK is disposed on the first, second, third, and fourth conductive layers CL1, CL2, CL3, and CL4, and an etchant ET is provided. Portions of the first, second, third, and fourth conductive layers CL1, CL2, CL3, and CL4, which are exposed without being covered by the mask MSK, may be etched by the etchant ET and removed.

The etchant ET may be the non-aqueous based solvent. Accordingly, the first, second, third, and fourth conductive layers CL1, CL2, CL3, and CL4 may be formed of materials having reactivity with respect to the etchant ET. However, this is merely exemplary, and the etchant ET may be selected from an aqueous-based solvent depending on the materials the first, second, third, and fourth conductive layers CL1, CL2, CL3, and CL4 as long as the first, second, third, and fourth conductive layers CL1, CL2, CL3, and CL4 are etched. The etchant ET should not be particularly limited.

The first, second, third, and fourth conductive layers CL1, CL2, CL3, and CL4 may be etched in the order of exposure to the etchant ET. Therefore, the first, second, third, and fourth conductive layers CL1, CL2, CL3, and CL4 may be etched in the order of the fourth conductive layer CL4, the third conductive layer CL3, the second conductive layer CL2, and the first conductive layer CL1. The fourth conductive layer CL4 may define an upper layer while one or more of the first, second and third layers CL1, CL2 and CL3 defines a lower layer. The upper layer may directly contact the lower layer.

The fourth conductive layer CL4 among the first, second, third, and fourth conductive layers CL1, CL2, CL3, and CL4 according to the present exemplary embodiment may be formed of a material having an etch rate similar to an etch rate of the first, second, and third conductive layers CL1, CL2, and CL3 with respect to the etchant ET. In detail, the fourth conductive layer CL4 may be formed of the material having the etch selectivity in the range equal to or greater than about 0.5 and equal to or smaller than about 3 as compared with the first, second, and third conductive layers CL1, CL2, and CL3.

Accordingly, the first, second, third, and fourth conductive layers CL1, CL2, CL3, and CL4 may be etched at a similar etch rate during the etching process. The first, second, third, and fourth layers L1, L2, L3, and L4 may include the side surfaces S1, S2, S3, and S4 aligned on the virtual line VL inclined at the predetermined angle $\theta_A$ with respect to the upper surface of the base substrate BS.

According to the present disclosure, as the uppermost layer corresponding to the fourth layer L4 is formed of the material having the etch selectivity in the range equal to or greater than about 0.5 and equal to or smaller than about 3 as compared with the first, second, and third layers L1, L2, and L3 that correspond to the lower layer, the difference in the etch rate between the uppermost layer and the lower layer may be reduced. Therefore, the pattern PT having the low reflectance and the improved process reliability may be easily formed.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display panel comprising:
   a base substrate;
   a pixel on the base substrate and comprising a thin film transistor and a display element which is connected to the thin film transistor; and
   a signal line connected to the pixel, wherein the signal line comprises:
      a lower layer comprising a conductive material; and
      an upper layer comprising a conductive material,
   wherein
   the lower layer comprises:
      a first layer on the base substrate;
      a second layer on the first layer; and
      a third layer disposed between the second layer and the upper layer,
   the upper layer has an etch selectivity in a range equal to or greater than about 0.5 and equal to or smaller than about 3 with respect to the lower layer, and
   the upper layer has a light reflectance lower than the second layer.

2. The display panel of claim 1, wherein within the signal line, the upper layer directly contacts the third layer.

3. The display panel of claim 1, wherein within the signal line, the upper layer comprises an opaque material and has a thickness equal to or smaller than about 100 angstroms.

4. The display panel of claim 3, wherein
   the second layer has a specific resistance lower than the first layer; and
   the third layer has a light reflectance lower than the second layer.

5. The display panel of claim 1, wherein within the signal line, the upper layer comprises a same material as the second layer of the lower layer.

6. The display panel of claim 1, wherein within the signal line, the upper layer has a thickness which is smaller than a thickness of each of the first, second and third layers of the lower layer.

7. The display panel of claim 1, wherein within the signal line, the upper layer and the second layer of the lower layer each comprise copper.

8. The display panel of claim 1, wherein within the signal line, the first, second, and third layers of the lower layer each comprise a different material from the upper layer.

9. The display panel of claim 1, wherein within the signal line, the upper layer comprises a transparent conductive oxide material, a metal material, or a metal oxide material.

10. The display panel of claim 1, wherein the etch selectivity is an etch selectivity with respect to a non-aqueous etchant.

11. The display panel of claim 1, wherein within the signal line,
    the upper layer comprises a side surface,
    the lower layer comprises a side surface and,
    the side surface of the upper layer and the side surface of the lower layer are aligned with each other along a virtual line in a cross-section of the base substrate.

12. The display panel of claim 11, wherein the virtual line is inclined with respect to an upper surface of the base substrate.

13. The display panel of claim 1, further comprising an insulating layer comprising an inorganic layer,
    wherein
    the signal line is provided in plurality comprising a first signal line and a second signal line each connected to the pixel, and
    the first signal line and the second signal line are in different layers from each other with the insulating layer interposed therebetween.

14. The display panel of claim 1, wherein the thin film transistor comprises:
    a control electrode,
    an input electrode and an output electrode spaced apart from each other, and
    the output electrode connected to the display element.

15. The display panel of claim 14, wherein at least one of the control electrode, the input electrode and the output electrode of the thin film transistor comprises the lower layer and the upper layer.

16. The display panel of claim 1, wherein
    the display element comprises a pixel electrode, a common electrode, and an optical control layer between the pixel electrode and the common electrode, and
    the upper layer and the lower layer within the signal line each overlaps with the pixel electrode in a plan view.

17. A display panel comprising:
    a base substrate;
    a pixel on the base substrate and comprising a thin film transistor and a display element which is connected to the thin film transistor; and a signal line connected to the pixel,
wherein the signal line comprises:
- an upper layer having a thickness equal to or smaller than about 100 angstroms; and
- a lower layer between the base substrate and the upper layer, wherein
the lower layer comprises:
- a first layer on the base substrate;
- a second layer on the first layer; and
- a third layer disposed between the second layer and the upper layer, and the upper layer has a light reflectance lower than the second layer.

18. The display panel of claim 17, wherein
the first layer comprises a first metal;
the second layer comprises a second metal different from the first metal, the second layer in contact with the first layer; and
the third layer comprises a third metal which is the same as the first metal, the third layer in contact with the second layer and the upper layer.

19. The display panel of claim 18, wherein within the signal line,
the upper layer comprises a metal substantially the same as the second metal of the second layer of the lower layer, and
the second layer of the lower layer is thicker than the upper layer.

20. The display panel of claim 18, wherein within the signal line, the third layer has a light reflectance lower than the second layer and a specific resistance higher than the second layer.

* * * * *